(12) United States Patent
Lai

(10) Patent No.: US 11,545,201 B2
(45) Date of Patent: Jan. 3, 2023

(54) MEMORY DEVICE WITH UNIPOLAR SELECTOR

(71) Applicant: Taiwan Semiconductor Manufacturing Co., Ltd., Hsin-Chu (TW)

(72) Inventor: Sheng-Chih Lai, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/908,914

(22) Filed: Jun. 23, 2020

(65) Prior Publication Data

US 2021/0398577 A1 Dec. 23, 2021

(51) Int. Cl.
*G11C 11/16* (2006.01)
*G11C 5/06* (2006.01)

(52) U.S. Cl.
CPC ............ *G11C 11/161* (2013.01); *G11C 5/06* (2013.01); *G11C 11/1659* (2013.01); *G11C 11/1673* (2013.01); *G11C 11/1675* (2013.01); *G11C 11/1697* (2013.01)

(58) Field of Classification Search
CPC ............ G11C 11/161; G11C 11/1659; G11C 11/1673; G11C 11/1675; G11C 11/1697; G11C 5/06
USPC .......................................................... 365/158
See application file for complete search history.

(56) References Cited

U.S. PATENT DOCUMENTS

| | | |
|---|---|---|
| 7,180,087 B1 | 2/2007 | Loss et al. |
| 10,991,756 B2 | 4/2021 | Lai et al. |
| 2011/0147942 A1 | 6/2011 | Yahashi et al. |
| 2011/0242885 A1* | 10/2011 | Kim ............... H01L 27/2481 365/163 |
| 2014/0160830 A1* | 6/2014 | Chung ................. G11C 17/18 365/96 |
| 2014/0313816 A1 | 10/2014 | Ribeiro et al. |
| 2018/0061467 A1* | 3/2018 | Kan .................. G11C 11/1659 |
| 2019/0244666 A1* | 8/2019 | Hsu ................... G11C 14/009 |
| 2020/0082858 A1 | 3/2020 | Kim et al. |
| 2020/0082885 A1* | 3/2020 | Lin .................. G11C 11/1675 |
| 2020/0127046 A1 | 4/2020 | Lai et al. |

FOREIGN PATENT DOCUMENTS

WO    WO-2017171718 A1 * 10/2017 ........... G11C 11/161

\* cited by examiner

*Primary Examiner* — Sung Il Cho
(74) *Attorney, Agent, or Firm* — Eschweiler & Potashnik, LLC

(57) ABSTRACT

Various embodiments of the present application are directed towards a memory cell, an integrated chip comprising a memory cell, and a method of operating a memory device. In some embodiments, the memory cell comprises a data-storage element having a variable resistance and a unipolar selector electrically coupled in series with the data-storage element. The memory cell is configured to be written by a writing voltage with a single polarity applying across the data-storage element and the unipolar selector.

20 Claims, 15 Drawing Sheets

US 11,545,201 B2

MEMORY DEVICE WITH UNIPOLAR SELECTOR

BACKGROUND

Many modern-day electronic devices include electronic memory. Electronic memory may be volatile memory or non-volatile memory (NVM). Non-volatile memory is able to store data in the absence of power, whereas volatile memory is not. Non-volatile memory such as magnetoresistive random-access memory (MRAM) and resistive random access memory (RRAM) are promising candidates for next generation non-volatile memory technology due to relative simple structures and their compatibility with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1, 2:
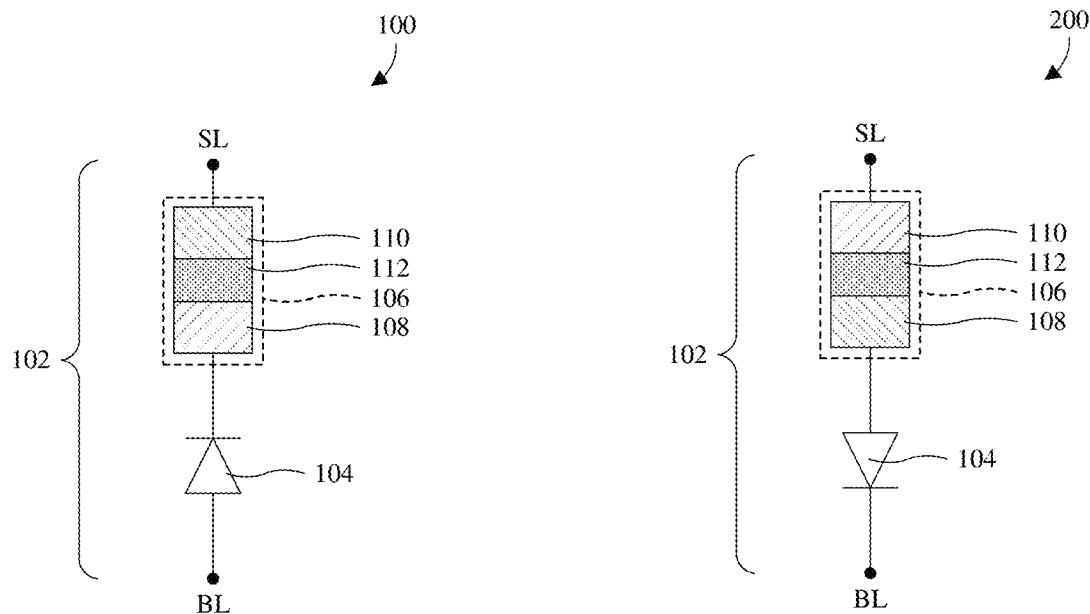
FIG. 1 illustrates a schematic diagram of some embodiments of a memory cell comprising a unipolar selector.
FIG. 2 illustrates a schematic diagram of some alternative embodiments of a memory cell comprising a unipolar selector.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A cross-point memory architecture with one-selector one-resistor (1S1R) memory cells is increasingly receiving attention for use with next generation electronic memory due to its high density. A cross-point memory array may, for example, comprise multiple one-selector one-resistor (1S1R) memory cells respectively arranged at cross points of bit lines and source lines. The selector is a bipolar device configured to pass bidirectional current when biased above respective threshold voltages. By appropriately biasing a bit line and a source line (e.g. BL0 and SL0), a 1S1R memory cell at a cross point of the bit line and the source line can be selected and written to opposite states. When a 1S1R memory cell is selected, other bit lines and source lines may be biased at a middle point voltage to turn off unselected memory cells. However, a first group of unselected memory cells shares the same bit line (BL0) with the selected 1S1R memory cell and thus is biased at a difference voltage of the bit line voltage and the middle point voltage. Similarly, a second group of unselected memory cells share the same source line (SL0) with the selected 1S1R memory cell and thus is biased at a difference voltage of the source line voltage and the middle point voltage. The collective leakage current flowing through the first group of unselected memory cells and the second group of unselected memory cells introduces disturbance and reduces the current window for memory operation for reading and writing operations. The disturbance may even result in a reading failure during the reading operation or a false writing during the writing operation.

In view of above, various embodiments of the present application are directed towards a memory cell using a unipolar selector, as well as a unipolar operation method of such memory cell. The unipolar selector may, for example, be a diode or some other suitable unipolar device that is turned on when a forward bias greater than its threshold voltage is applied. The unipolar selector is electrically coupled in series with a data-storage element and controls current flowing through the data-storage element or voltage applied across the data-storage element. In some embodiments, the memory cell is read from and written to at a single polarity and cannot be rewritten. In some alternative embodiments, a reset operation may be performed by other means such as using an external magnetic field generated by an off-board or on-board magnetic field generator. By using the unipolar selector rather than the bipolar selector, unselected memory cells can be biased at the opposite polarity and thus minimize leakage current and reduce reading and writing disturbance.

With reference to FIG. 1, a schematic diagram 100 of some embodiments of a memory cell 102 comprising a unipolar selector 104 is provided. A unipolar selector switches at a single polarity whereas a bipolar selector switches at two polarities. At a first polarity, the unipolar selector conducts and/or is in a low resistance state called "on" state if the voltage across the unipolar selector exceeds a threshold voltage. Otherwise, at the first polarity, the unipolar selector is non-conducting or is in a high resistance state called "off" state. At the second polarity, the unipolar selector is in the "off" state. The unipolar selector 104 is configured to selectively allow current to flow in a first direction from a bit line BL to a source line SL, while blocking the flow of current in a second direction from the source line SL to the bit line BL. In some embodiments, the unipolar selector 104 has only two terminals. In some alternative embodiments, the unipolar selector 104 has more than two terminals. The unipolar selector 104 may, for example, be PIN diodes, polysilicon diodes, punch-through diodes, varistor-type selectors, ovonic threshold switches (OTSs), doped-chalcogenide-based selectors, Mott effect based selectors, mixed-ionic-electronic-conductive (MIEC)-based selectors, field-assisted-superliner-threshold (FAST) selectors, filament-based selectors, doped-hafnium-oxide-based selectors, or some other suitable diodes and/or selectors.

The unipolar selector 104 is electrically coupled in series with a data-storage element 106, from the bit line BL to the source line SL. In some embodiments, locations of the bit line BL and the source line SL can be reversed. An example of the operation is as follows: when the voltage across the unipolar selector 104 is positive from the bit line BL to the data-storage element 106, the unipolar selector 104 conducts and is in a low resistance state if the voltage across the unipolar selector 104, from the bit line BL to the data-storage element 106, exceeds a threshold voltage Vt. Otherwise, the unipolar selector 104 is non-conducting and/or is in a high resistance state. The data-storage element 106 stores a bit of data. As an example, during the writing operation, a writing voltage is applied such that the unipolar selector 104 is biased above the threshold voltage at the first polarity and the data-storage element 106 is set to a first data state. During the reading operation, a reading voltage is applied such that the unipolar selector 104 is biased above the threshold voltage at the first polarity while the data-storage element 106 is not altered. The reading voltage may be smaller than the writing voltage.

In some embodiments, a resistance of the data-storage element varies depending upon a data state of the data-storage element 106. For example, the data-storage element 106 may have a low resistance at a first data state and may have a high resistance at a second data state. In other embodiments, capacitance or some other suitable parameter of the data-storage element 106 varies depending upon a data state of the data-storage element 106. In some embodiments, the data-storage element 106 is a magnetic tunnel junction (MTJ) or a spin-valve and is written by a spin-transfer torque (STT) method. In such cases, the memory cell 102 is referred as a STT magnetic memory cell, and the memory device made of an array of such memory cells is referred as a STT-MRAM device. The STT method is described in more details below. In some alternative embodiments, the data-storage element 106 is a metal-insulator-metal (MIM) stack, and the memory cell 102 may be a resistance memory cell. Other structures for the data-storage element 106 and/or other memory-cell types for the memory cell 102 are also amenable.

As an example, the data-storage element 106 comprises a reference ferromagnetic element 108, a free ferromagnetic element 110, and a barrier element 112 and stores data using the STT method. The barrier element 112 is non-magnetic and is sandwiched between the reference ferromagnetic element 108 and free ferromagnetic element 110. The reference ferromagnetic element 108 has a fixed magnetization, whereas the free ferromagnetic element 110 has variable a magnetization. The barrier element 112 can be a tunneling barrier layer. In some embodiments, a spin-polarized current is created by passing a current though the reference ferromagnetic element 108. This current is then directed into free ferromagnetic elements 110, transfers the angular momentum, and changes the spin of the electrons in the free ferromagnetic elements 110. Magnetic moments of the reference ferromagnetic element 108 and the free ferromagnetic element 110 can be in-plane or perpendicular to a silicon substrate surface. Devices with perpendicular magnetic moments are more scalable compared to those with in-plane moments and are also more cost competitive. Depending upon whether magnetizations of the reference ferromagnetic element 108 and free ferromagnetic element 110 are parallel or anti-parallel, the data-storage element 106 has a low resistance or a high resistance. For example, the data-storage element 106 may have the low resistance when the magnetizations of the reference ferromagnetic element 108 and free ferromagnetic element 110 are parallel and may have the high resistance when the magnetizations are anti-parallel. The low and high resistances may, in turn, be used to represent different data states of the data-storage element 106.

In some embodiments, the barrier element 112 is a tunnel barrier selectively allowing quantum mechanical tunneling of electrons through the barrier element 112. For example, quantum mechanical tunneling may be allowed when the reference ferromagnetic element 108 and free ferromagnetic element 110 have parallel magnetizations, and may be blocked when the reference ferromagnetic element 108 and free ferromagnetic element 110 have antiparallel magnetizations. The barrier element 112 may, for example, be or comprise an amorphous barrier, a crystalline barrier, or some other suitable barrier. The amorphous barrier may be or comprise, for example, aluminum oxide (e.g., $AlO_x$), titanium oxide (e.g., $TiO_x$), or some other suitable amorphous barrier. The crystalline barrier may be or comprise manganese oxide (e.g., MgO), spinel (e.g., $MgAl_2O_4$), or some other suitable crystalline barrier.

In some embodiments, the reference ferromagnetic element 108 is or comprises cobalt iron (e.g., CoFe), cobalt iron boron (e.g., CoFeB), or some other suitable ferromagnetic material(s), or any combination of the foregoing. In some embodiments, the reference ferromagnetic element 108 adjoins an antiferromagnetic element (not shown) and/or is part of or otherwise adjoins a synthetic antiferromagnetic (SAF) element (not shown). In some embodiments, the free ferromagnetic element 110 is or comprises cobalt iron (e.g., CoFe), cobalt iron boron (e.g., CoFeB), or some other suitable ferromagnetic material(s), or any combination of the foregoing.

With reference to FIG. 2, a schematic diagram 200 of some alternative embodiments of the memory cell 102 of FIG. 1 is provided in which the reference ferromagnetic element 108 overlies the free ferromagnetic element 110. Since the reference ferromagnetic element 108 overlies the free ferromagnetic element 110, the polarities at which the writing voltage is applied across the data-storage element 106 are reversed compared to FIG. 1. The writing voltage is applied across the data-storage element 106 at the second polarity to set the data-storage element 106 to the antiparallel state.

Figures 3, 4:
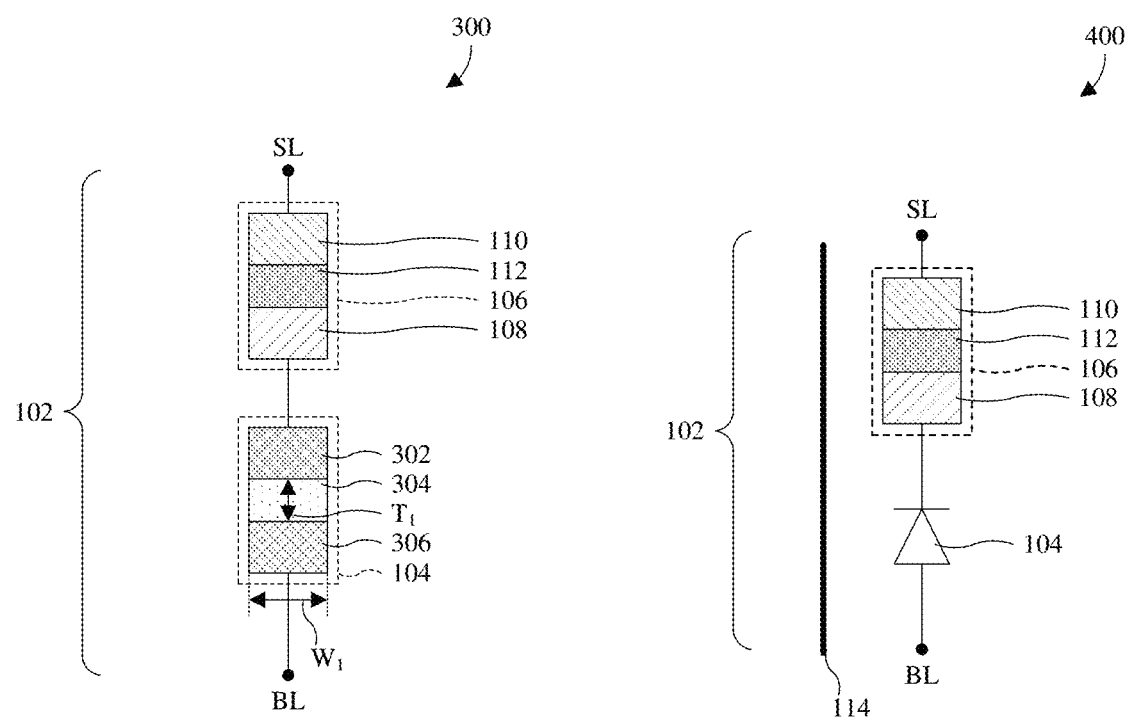
FIG. 3 illustrates a schematic diagram of some more detailed embodiments of the memory cell of FIG. 1 in which the unipolar selector comprises a multilayer stack.
FIG. 4 illustrates a schematic diagram of some embodiments of the memory cell of FIG. 1 comprising a unipolar selector and a magnetic field generator coupled to the memory cell.

With reference to FIG. 3, a schematic diagram 300 of some more detailed embodiments of the memory cell 102 of FIG. 1 is provided in which the unipolar selector 104 is a multilayer stack. The unipolar selector 104 comprises a cathode 302, an insulator 304, and an anode 306. The insulator 304 is sandwiched between the cathode 302 and the anode 306. In some embodiments, the cathode 302 is directly connected to the reference ferromagnetic element 108 of the data-storage element 106, meaning the cathode 302 is electrically connected to the reference ferromagnetic element 108 by one or more conductive wires and/or vias without other electronic devices disposed therebetween. In some alternative embodiments, the unipolar selector 104 may be reversely placed that the anode 306 is directly connected to the reference ferromagnetic element 108. The multilayer stacks may, for example, be or comprise a PIN diode or some other multilayer devices. In some embodiments in which the multilayer stack is a PIN diode, the cathode 302 is or comprises N-type semiconductor material, the anode 306 is or comprises P-type semiconductor material, and the insulator 304 is or comprises intrinsic or lightly doped semiconductor material. The insulator 304 may, for example, be lightly doped relative to the cathode 302 and/or the anode 306. The semiconductor material of the multilayer stacks may, for example, be or comprises polysilicon, monocrystalline silicon, germanium, indium gallium arsenide, or some other suitable semiconductor material. In some embodiments in which the multilayer stack is a MIM device, the cathode 302 and the anode 306 are or comprise metal or some other suitable conductive material and/or the insulator 304 is or comprises doped hafnium oxide, some other suitable metal oxide, or some other suitable insulator material.

In some embodiments, a thickness $T_1$ of the insulator 304 is varied to adjust the threshold voltage of the unipolar selector 104. For example, increasing a thickness of an insulator may increase a threshold voltage of the corresponding unipolar selector whereas decreasing the thickness may decrease the threshold voltage. In some embodiments, a doping concentration of the insulator 304 is varied to adjust the threshold voltage of the unipolar selector 104. For example, increasing a doping concentration of an insulator may decrease a threshold voltage of the corresponding selector whereas decreasing the doping concentration may increase the threshold voltage. In some embodiments, a width Wi of the unipolar selector 104 is varied to adjust an "on" resistance of the unipolar selector 104. For example, increasing a width of a selector may decrease an "on" resistance of the selector whereas decreasing the width may increase the "on" resistance.

With reference to FIG. 4, a schematic diagram 400 of some embodiments of the memory cell of FIG. 1 is provided in which a magnetic field generator 114 is coupled to the data-storage element 106. The magnetic field generator 114 may be a current carrying wire configured to generate a magnetic field that can change polarity of the free ferromagnetic element 110 and thus change data state of the data-storage element 106. In some embodiments, the magnetic field generator 114 is controlled by a controller and configured to generate an external magnetic field that resets the data-storage element 106 to the status opposite to the writing operation. An exemplary memory array application of the memory cell shown by FIG. 4 is given later with reference to FIG. 9A or FIG. 9B.

Figure 5:
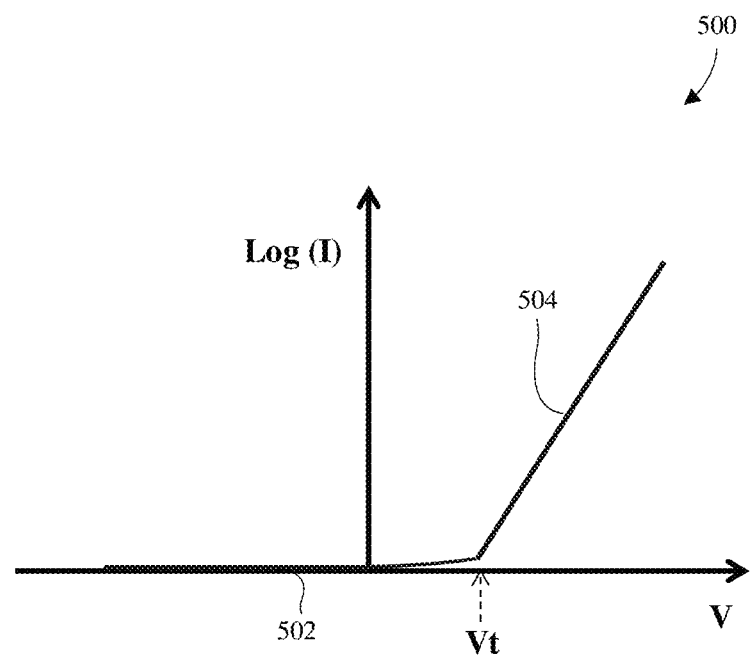
FIG. 5 illustrates a graph of some embodiments of current-voltage (I-V) curves for the unipolar selector of FIG. 1.

With reference to FIG. 5, a graph 500 of some embodiments of current-voltage (I-V) curves for the unipolar selector 104 of FIG. 1 is provided. A horizontal axis of the graph 500 corresponds to voltage, and a vertical axis of the graph 500 corresponds to current. Further, a right side of the graph 500 corresponds to the first polarity of the unipolar selector 104, and a left side of the graph 500 corresponds to the second polarity of the unipolar selector 104. The graph 500 includes a first I-V curve 502 where the bias V applied on the unipolar selector 104 is smaller than the threshold voltage $V_t$, and a second I-V curve 504 where the bias V applied on the unipolar selector 104 is greater than the threshold voltage Vt. As shown by the first I-V curve 502, current is minimum when the voltage V applied on the unipolar selector 104 is smaller than the threshold voltage $V_t$ of the unipolar selector 104. As shown by the second I-V curve 504, current increases when the voltage V applied on the unipolar selector 104 exceeds the threshold voltage $V_t$ of the unipolar selector 104.

Figure 6A:
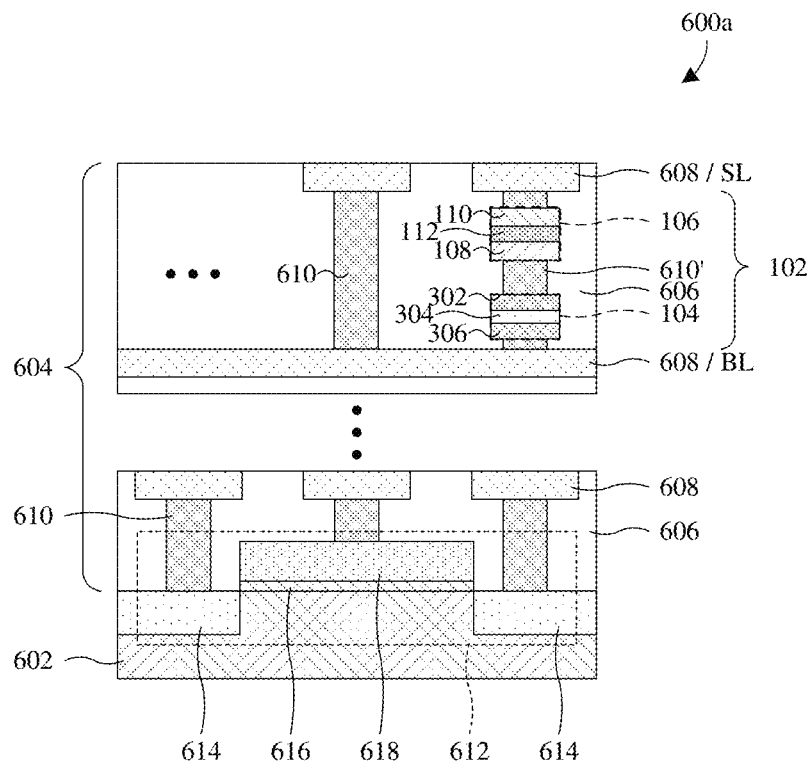
FIGS. 6A-6D illustrate cross-sectional views of varies embodiments of an integrated chip comprising the memory cell of FIG. 1, FIG. 2, FIG. 3, or FIG. 4.

With reference to FIG. 6A, a cross-sectional view 600a of some embodiments of an integrated chip comprising the memory cell 102 of FIG. 1 is provided. The memory cell 102 overlies a substrate 602 and is located within an interconnect structure 604 that covers the substrate 602. The interconnect structure 604 may be a back-end-of-line (BEOL) structure that comprises a plurality of wires 608 and a plurality of vias 610 surrounded by an interconnect dielectric layer 606. The interconnect dielectric layer 606 may, for example, be or comprise silicon oxide, a low κ dielectric, some other suitable dielectric(s), or any combination of the foregoing. As used herein, a low κ dielectric may be, for example, a dielectric with a dielectric constant κ less than about 3.9. The wires 608 and the vias 610 are alternatingly stacked in the interconnect dielectric layer 606 to define conductive paths interconnecting components of the memory cell 102 and/or connecting the memory cell 102 to other devices (not shown) in the integrated chip. The wires 608 and the vias 610 may, for example, be or comprise metal, some other suitable conductive material(s), or any combination of the foregoing. For example, an intermediate via 610' may define conductive paths electrically coupling the unipolar selector 104 in series with the data-storage element 106. In some embodiments, due to the simplified structure of the disclosed selector, the memory cell 102 (including the unipolar selector 104 and the data-storage elements 106) may be inserted between two direct neighboring layers of metal wires. Therefore, the position of the memory cell 102 is more easily co-optimized with place and route requirement. The intermediate via 610' may have a smaller height than the vias 610.

Figure 6B:
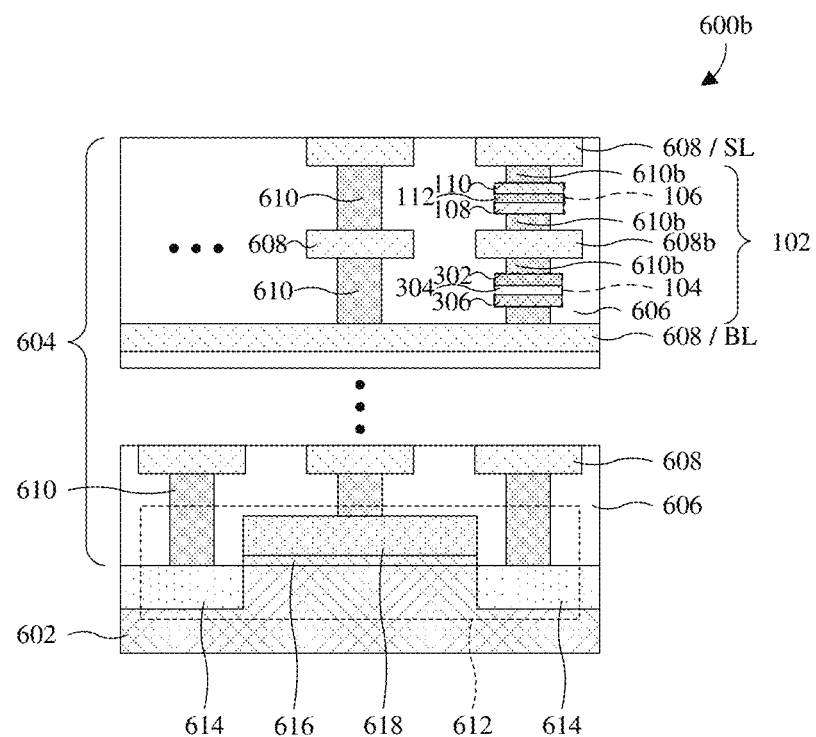

With reference to FIG. 6B, a cross-sectional view 600b of some alternative embodiments of an integrated chip comprising the memory cell 102 of FIG. 1 is provided. Besides the similar features discussed above associated with FIG. 6A, in some alternative embodiments, the memory cell 102 (including the unipolar selector 104 and the data-storage elements 106) is inserted between two non-neighboring layers of metal wires 608, and one or more additional wire layers may exist therebetween. The unipolar selector and the data-storage element 106 may be connected by multiple sub-vias 610b connected by one or more isolated metal islands 608b. The isolated metal islands 608b has a width equal to that of the other wires 608 of the same interconnect layer and does not connect to other memory cells. The sub-vias 610b may have a smaller greater height than the vias 610. Here, two components are considered as "directly connected" if only conductive lines such as wires 608, the isolated metal islands 608b, and/or the vias 610 are used to connect the two components and no other electronic components are inserted therebetween. For example, the unipolar selector 104 and the data-storage element 106 are directly connected in this case.

Figure 6C:
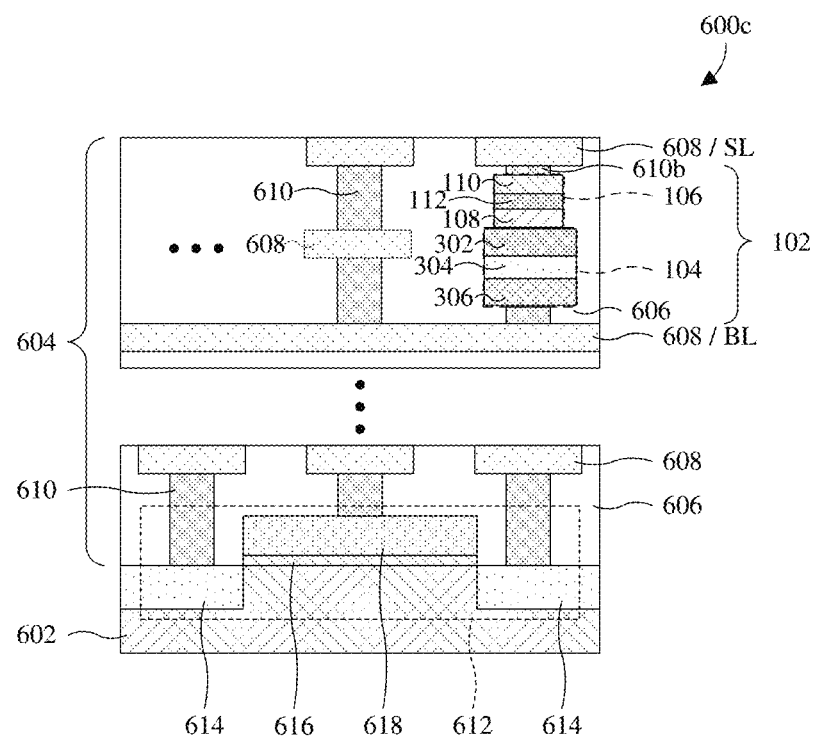

With reference to FIG. 6C, a cross-sectional view 600c of some alternative embodiments of an integrated chip comprising the memory cell 102 of FIG. 1 is provided. Besides the similar features discussed above associated with FIGS. 6A-6B, the unipolar selector 104 and the data-storage element 106 may also be directly stacked one above another. Thus, a bottom surface of the reference ferromagnetic element 108 of the data-storage element 106 and a top surface of the cathode 302 of the unipolar selector 104 may directly contact one another. Though not shown in figures, in some alternative embodiments, the free ferromagnetic element 110 of the data-storage element 106 may have a top/bottom surface directly contacting a top/bottom surface of the anode 306 or the cathode 302, or the anode 306 may have a top/bottom surface directly contacting a top/bottom surface of the free ferromagnetic element 110 or the reference ferromagnetic element 108. The cathode 302 and the anode 306 may have the same lateral dimensions. The free ferromagnetic element 110 and the reference ferromagnetic element 108 may have the same lateral dimensions. In some embodiments, the unipolar selector 104 has a lateral area between approximately 1 to 5 times a lateral area of the data-storage element 106, which is a smaller size than an access transistor and at a higher quality than other types of bipolar selectors. Accordingly, the resulting memory cell is able to have relatively small size and good performance (e.g., high endurance and access speed). Lateral dimensions include length and width dimensions in parallel with surface of substrate. The memory cell 102 may be inserted between two neighboring or non-neighboring layers of metal wires 608, and one or more additional wire layers may or may not exist therebetween.

Figure 6D:
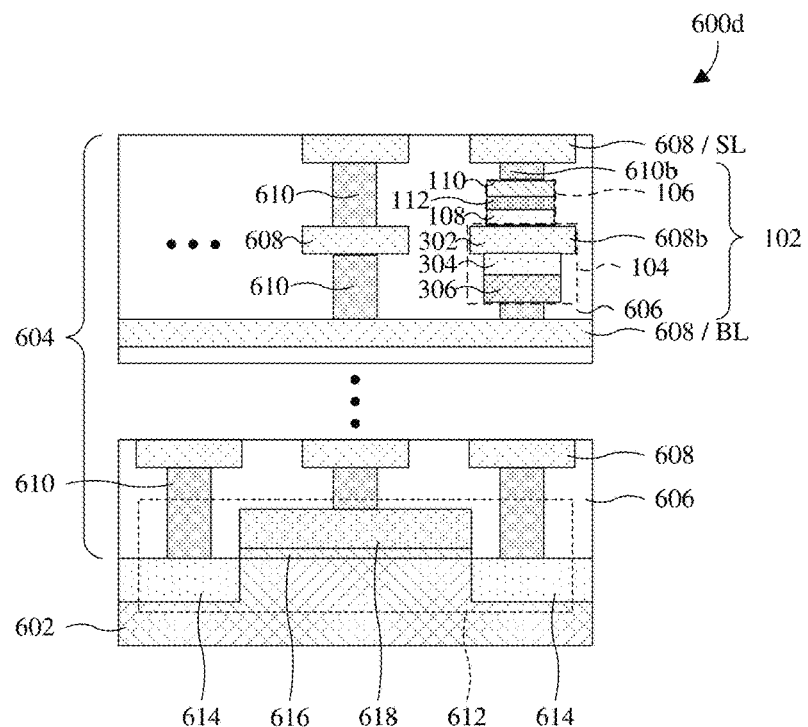

With reference to FIG. 6D, a cross-sectional view 600d of some alternative embodiments of an integrated chip comprising the memory cell 102 of FIG. 1 is provided. Besides the similar features discussed above associated with FIGS. 6A-6C, the isolated metal islands 608b may be used as the cathode 302 of unipolar selector 104. The unipolar selector 104 can also be reversed, and the isolated metal islands 608b can be used as the anode 306. In this case, the cathode 302 and the anode 306 may have different lateral dimensions. The isolated metal islands 608b has a width equal to that of the other wires 608 of the same interconnect layer. The insulator 304 therebetween may have the same width with one of the cathode 302 or the anode 306 not functioned by the isolated metal islands 608b and greater than that of the isolated metal islands 608b. By using the isolated metal islands 608b as one electrode of the unipolar selector 104, the manufacturing process is further simplified, and the device structure is more compact.

In some embodiments, the integrated chip is a stand alone memory. In some alternative embodiments, the memory cell 102 is embedded in a logic circuit disposed on the substrate 602. For example, a semiconductor device 612 is disposed on the substrate 602 integrating with the memory cell 102. In some embodiments, the semiconductor device 612 is electrically coupled to the memory cell 102 by the wires 608 and the vias 610. The semiconductor device 612 may, for example, be a metal-oxide-semiconductor (MOS) device, an insulated-gate field-effect transistor (IGFET), or some other suitable semiconductor device. In some embodiments, the semiconductor device 612 comprises a pair of source/drain regions 614, a gate dielectric layer 616, and a gate electrode 618. The source/drain regions 614 are in the substrate 602, along a top surface of the substrate 602. The gate dielectric layer 616 and the gate electrode 618 are stacked over the substrate 602, vertically between the substrate 602 and the interconnect structure 604 and laterally between the source/drain regions 614.

Figure 7:
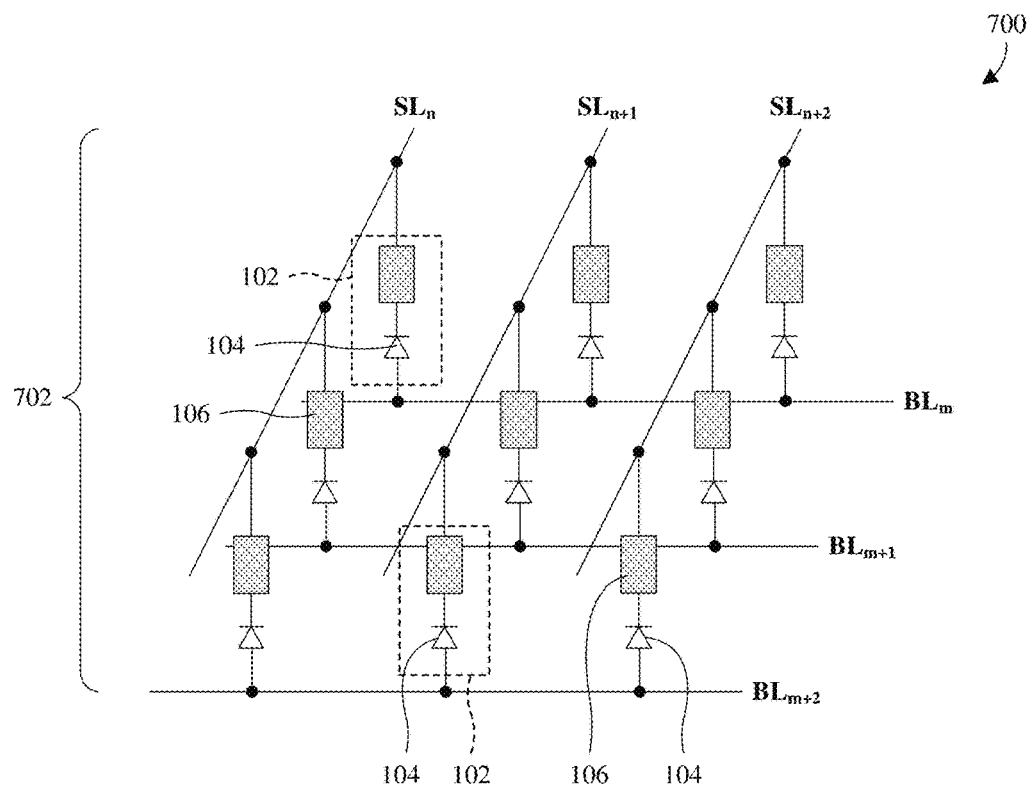
FIG. 7 illustrates a schematic view of some embodiments of a memory array comprising a plurality of memory cells of FIG. 1, FIG. 2, or FIG. 3.

With reference to FIG. 7, a schematic view 700 of some embodiments of a memory array 702 comprising a plurality of memory cells 102 in a plurality of rows and a plurality of columns is provided. The memory cells 102 respectively comprises the unipolar selector 104 electrically coupled in series with the data-storage elements 106. The memory cells 102 may, for example, each be as illustrated and described with regard to FIGS. 1-3. As an example, bit lines (e.g. $BL_m$, $BL_{m+1}$, $BL_{m+2}$) extend laterally along corresponding rows of the memory array and electrically couple with memory cells in the corresponding rows, whereas source lines (e.g. $SL_n$, $SL_{n+1}$, and $SL_{n+2}$) extend laterally along corresponding columns of the memory array and electrically couple with memory cells in the corresponding columns. The subscripts identify corresponding rows or columns and m or n is an integer variable representing a row or a column in the memory array 702. Example numbers of m or n are 256, 512, 1024, etc. By appropriately biasing a bit line and a source line, the memory cell at the cross point of the bit line and the source line may be selected for reading or writing.

Figure 8A:
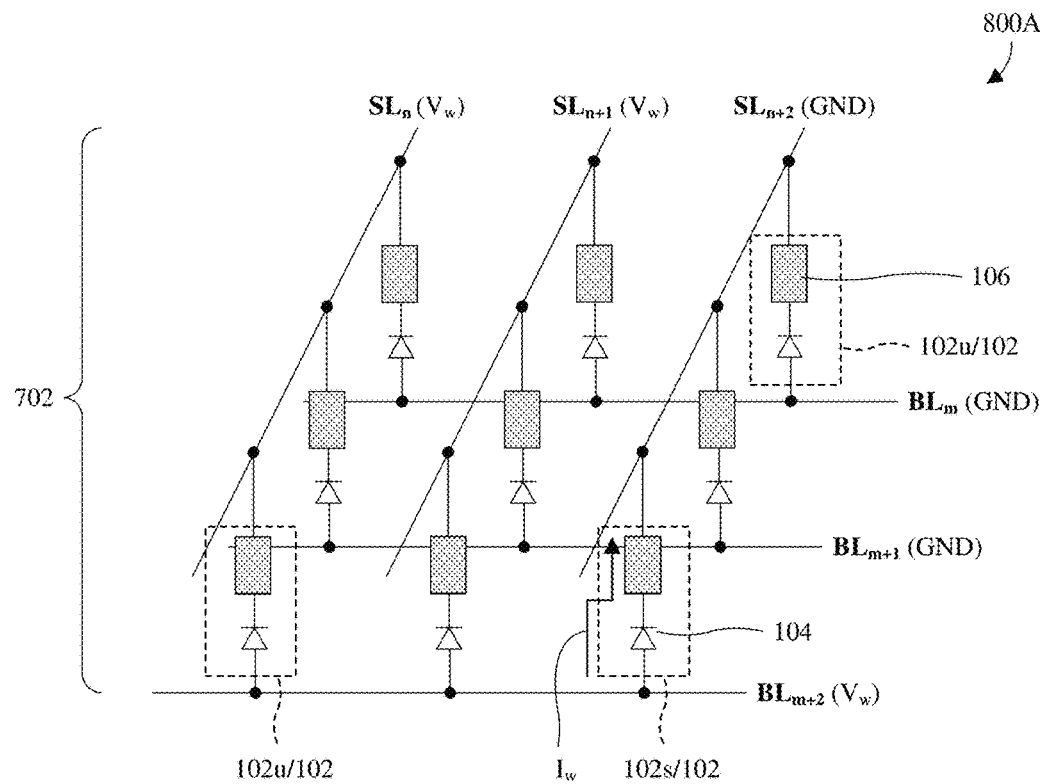
FIGS. 8A-8B illustrate schematic views of some embodiments of the memory array of FIG. 7 at various operational states.
Figure 8B:
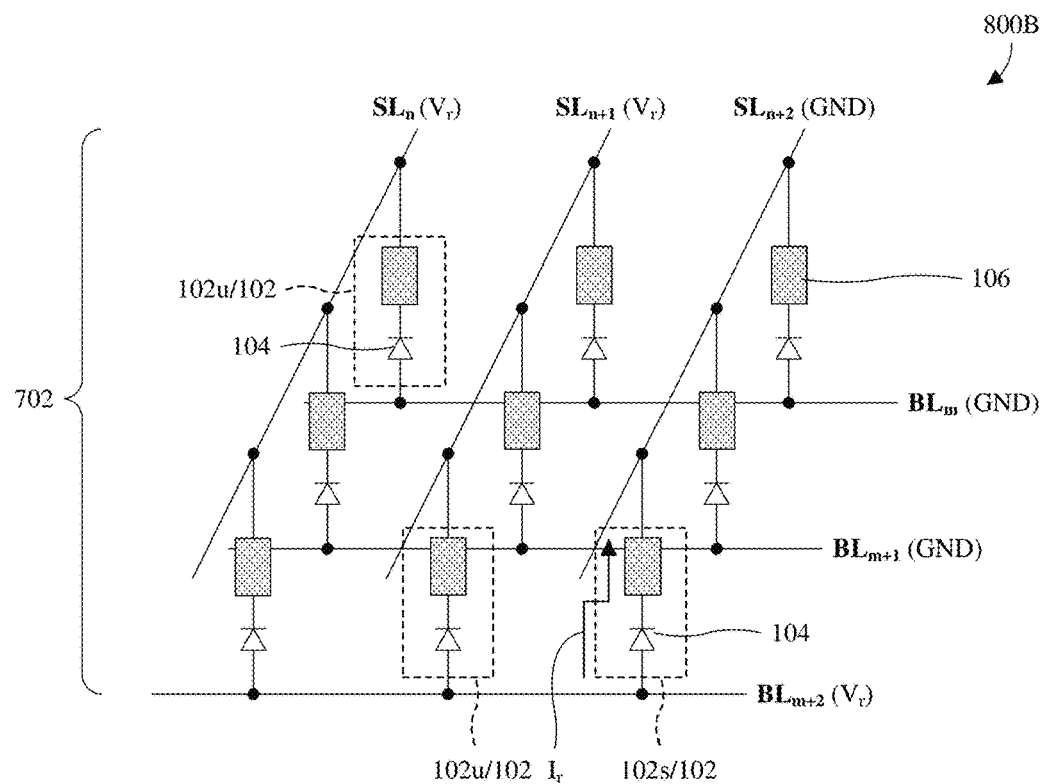

With reference to FIG. 8A-8B, schematic diagram 800A-800B of some embodiments of the memory array 702 of FIG. 7 are provided at various operational states to illustrate operation of the memory array 702. The memory array 702 may be used as a read only memory device for which all memory cells are pre-set to a first data state (e.g., a logic "0") in a test stage or a specific environment. Once selected, a memory cell can only be written to a second data state (e.g., a logic "1") by a current flowing through the memory cell or a voltage applying across the memory cell with single polarity. The memory array 702 may be pre-set by an external magnetic field or an on-board magnetic field generator. FIG. 8A illustrates the memory array 702 while writing a selected memory cell 102s to a second data state (e.g., a logic "1"). FIG. 8B illustrates the memory array 702 while reading a state of the selected memory cell 102s.

As illustrated by FIG. 8A, the selected memory cell 102s is at the cross point of the source line $SL_{n+2}$ and the bit line $BL_{m+2}$, for example. The bit line $BL_{m+2}$ is biased with a writing voltage Vw while the source line $SL_{n+2}$ is grounded. The writing voltage Vw is positive from the bit line $BL_{m+2}$ to the source line $SL_{n+2}$, and provides a bias to the unipolar selector 104 exceeding the threshold voltage of the unipolar selector 104, such that the selected memory cell 102s is at a first polarity and the unipolar selector 104 of the selected memory cell 102s is "on". Current Iw flows through the selected memory cell 102s and sets the data-storage element 106 of the selected memory cell 102s to the second data state (e.g., a logic "1"). For example, the data-storage element 106 can be a MTJ structure and can be written by spin-transfer torque induced by the current Iw.

In some embodiments, other unselected memory cells 102u are reversely biased by an inhibiting voltage at a second polarity opposite to the first polarity to keep the unselected memory cells "off" when writing the selected memory cell 102s. The inhibiting voltage may have an absolute value that is equal to that of the writing voltage Vw or some other fractions of the writing voltage Vw. Alternatively, the inhibiting voltage may have an absolute value that is greater than the writing voltage Vw. For example, some unselected memory cells 102u share the source line $SL_{n+2}$ or the bit line $BL_{m+2}$ with the selected memory cell 102s. However, corresponding bit lines $BL_m$, $BL_{m+1}$ and source lines $SL_n$, $SL_{n+1}$ connecting these unselected memory cells 102u are oppositely biased. For example, the source line $SL_{n+2}$ and the bit line $BL_m$, are both grounded, and the source line $SL_n$ and the bit line $BL_{m+2}$ are both biased at Vw or some other fraction of the writing voltage Vw. Accordingly, current flowing through the unselected memory cells 102u is reduced or prevented, and writing disturbance to the unselected memory cells 102u is reduced. In some embodiments, source lines $SL_n$, $SL_{n+1}$ are biased with the writing voltage Vw or some other fraction of the writing voltage Vw while bit lines $BL_m$, $BL_{m+1}$ can be grounded. Thus, leakage current and its resulting writing disturbance can be reduced.

As illustrated by FIG. 8B, the bit line $BL_{m+2}$ is biased with a read voltage $V_r$, while source line $SL_{n+2}$ is grounded. The read voltage $V_r$ is smaller than the writing voltage Vw and is small enough that the resulting read current $I_r$ does not change a state of the selected memory cell 102s. For example, the writing voltage Vw can be in a range of about 0.3V to about 1V, and the reading voltage $V_r$ can be smaller than 0.3V such that the state of the selected memory cell 102s is not altered. The reading voltage $V_r$ also needs to be able to turn on the unipolar selector 104 of the selected memory cell 102s such that current can flow through the data-storage element 106. For example, the reading voltage $V_r$ may need to be equal or greater than 0.1V. The read current $I_r$ can be used to decide the resistances of the data-storage elements 106 and the corresponding data states of the selected memory cell 102s. Similar to the writing operation, unselected memory cells 102u are biased at a second polarity opposite to the first polarity when applying the reading voltage $V_r$ across the selected memory cell 102s. The unselected memory cells 102u may be reversely biased by an inhibiting voltage having an absolute value that is equal to that of the reading voltage. Thus, leakage current and its resulting reading disturbance can be reduced.

Figure 9A:
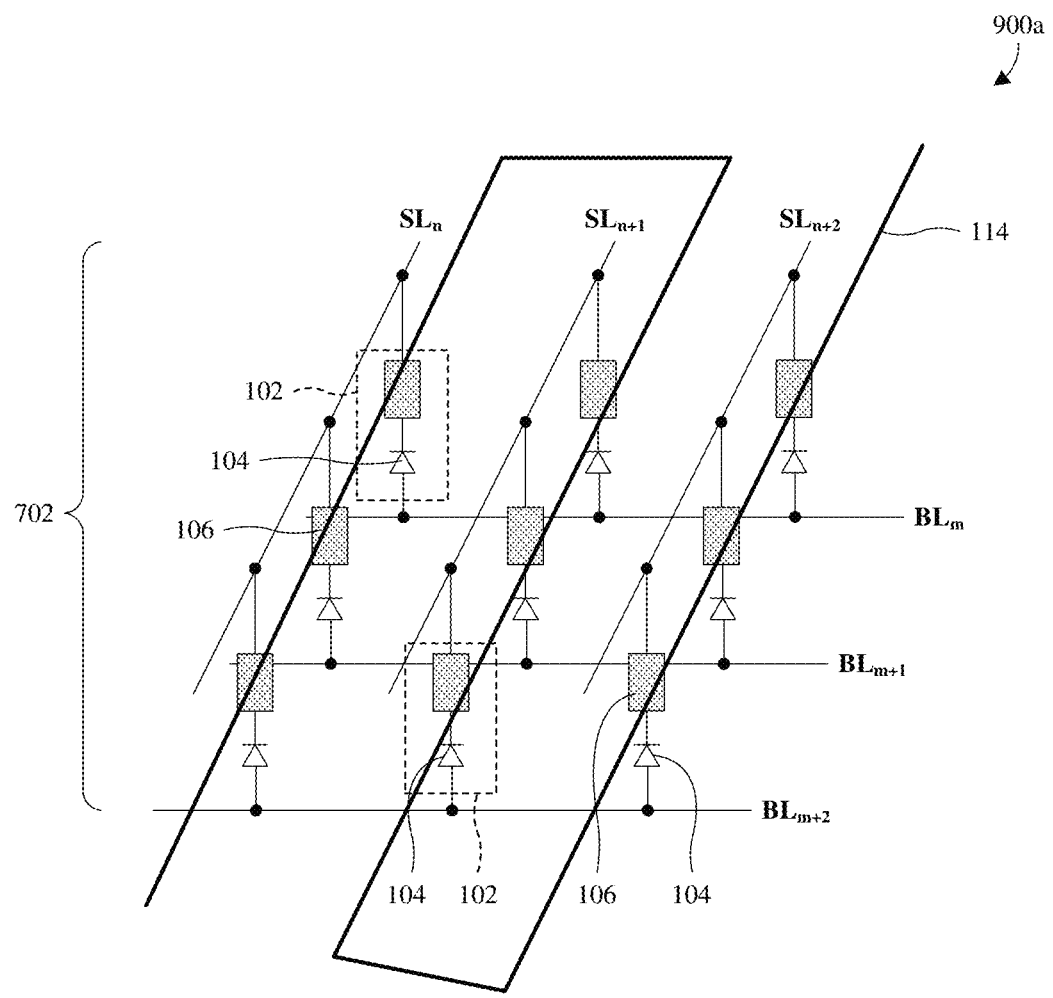
FIGS. 9A-9B illustrate schematic views of varies embodiments of the memory array comprising a plurality of memory cells of FIG. 4.
Figure 9B:
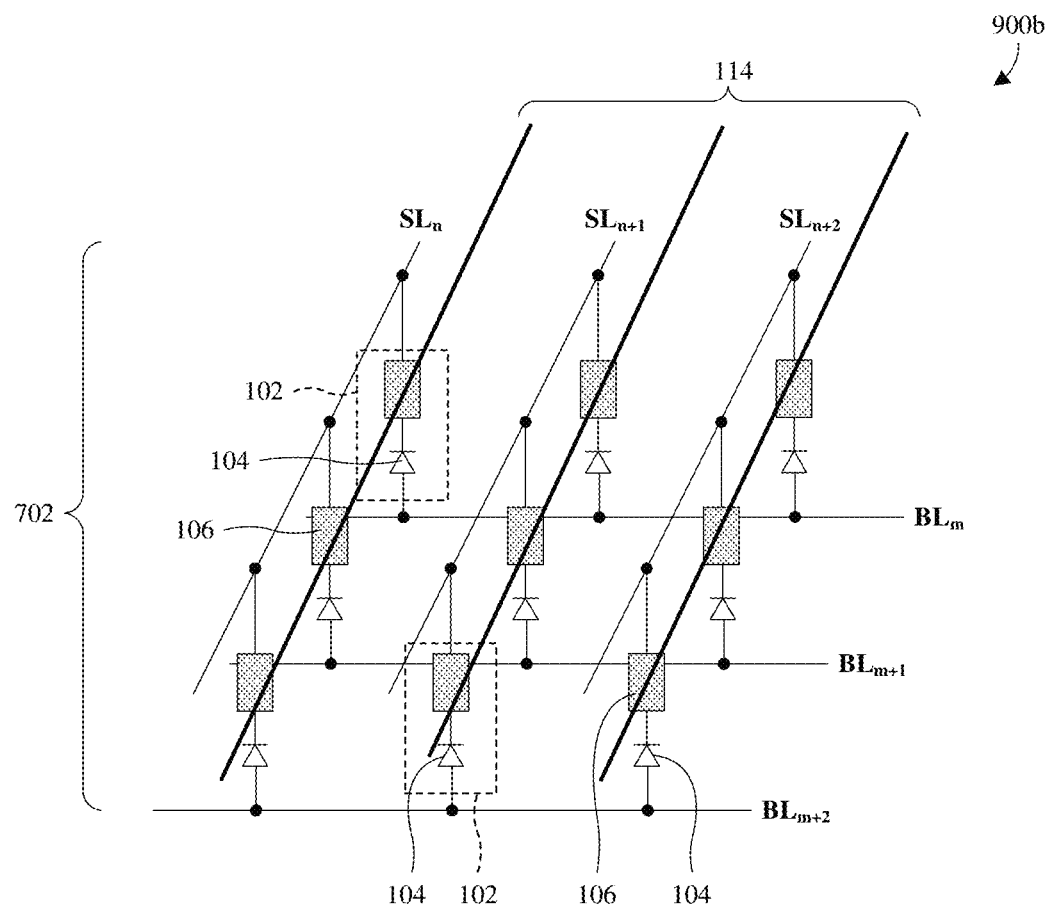

With reference to FIG. 9A and FIG. 9B, schematic views 900a, 900b of the memory array 702 comprising a magnetic field generator 114 coupled to the plurality of memory cells 102 is provided according to some further embodiments. In addition to the description above related to FIG. 7 and FIGS. 8A-B, the magnetic field generator 114 may be arranged next to the plurality of memory cells 102 to provide an external magnetic field to set or reset status of the plurality of memory cells 102. As shown in FIG. 9A, the magnetic field generator 114 may be a current carrying wire arranged alongside the plurality of memory cells 102. As shown in FIG. 9B, the magnetic field generator 114 may comprise a plurality of current carrying wires that can be be separately controlled such that the memory cells 102 can be reset by groups, or even individually.

Figure 10:
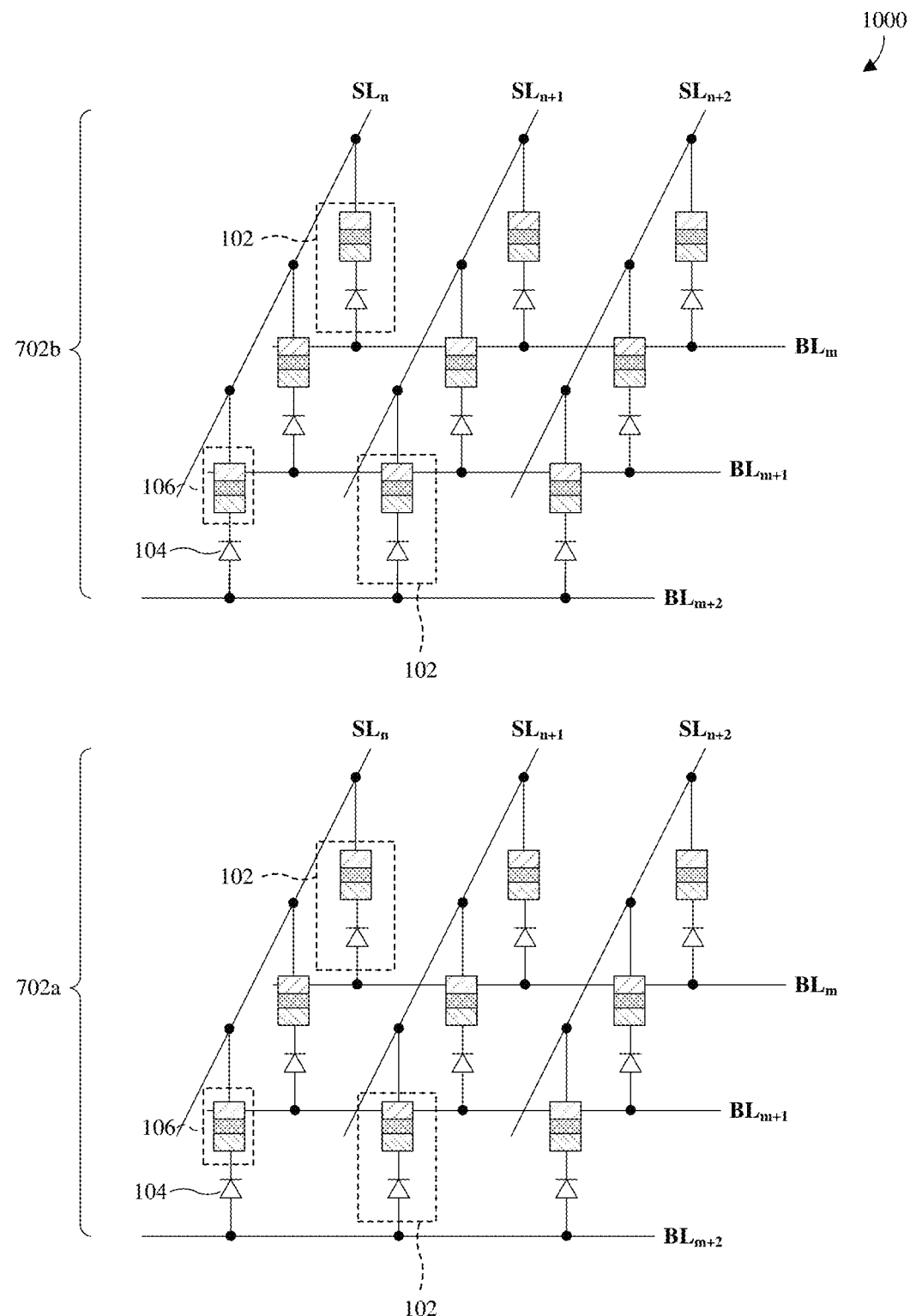
FIGS. 10 and 11 illustrate schematic views of various embodiments of a three dimensional (3D) memory array comprising stacked memory arrays of memory cells of FIG. 1, FIG. 2, FIG. 3 or FIG. 4.

With reference to FIG. 10, a schematic view 1000 of some embodiments of a three dimensional (3D) memory array comprising a first memory array 702a and a second memory array 702b is provided. The first memory array 702a and the second memory array 702b are stacked, such that the second memory array 702b overlies and is spaced from the first memory array 702a. Stacking the first memory array 702a and the second memory array 702b may, for example, enhance memory density. In some embodiments, as illustrated, the first memory array 702a and the second memory array 702b are each as the memory array 702 in FIG. 7 is illustrated and described. As an example, anodes of the unipolar selectors 104 of the first memory array 702a are connected to the first plurality of bit lines $BL_m$, $BL_{m+1}$, and $BL_{m+2}$. Cathodes of the unipolar selectors 104 of the first memory array 702a are connected to first terminals of the data-storage element 106 of the first memory array 702a. Second terminals of the data-storage elements 106 of the first memory array 702a are respectively connected to a first plurality of source lines $SL_n$, $SL_{n+1}$, and $SL_{n+2}$. Anodes of the unipolar selectors 104 of the second memory array 702b are connected to the second plurality of bit lines $BL_m$, $BL_{m+1}$, and $BL_{m+2}$. Cathodes of the unipolar selectors 104 of the second memory array 702b are connected to first terminals of the data-storage elements 106 of the second memory array 702b. Second terminals of the data-storage elements 106 of the second memory array 702b are respectively connected to a second plurality of source lines $SL_n$, $SL_{n+1}$, and $SL_{n+2}$. Alternatively, it is appreciated by person in the art that the unipolar selectors 104 and the data-storage elements 106 of the first memory array 702a and the second memory array 702b can respectively arranged in mirror.

Figure 11:
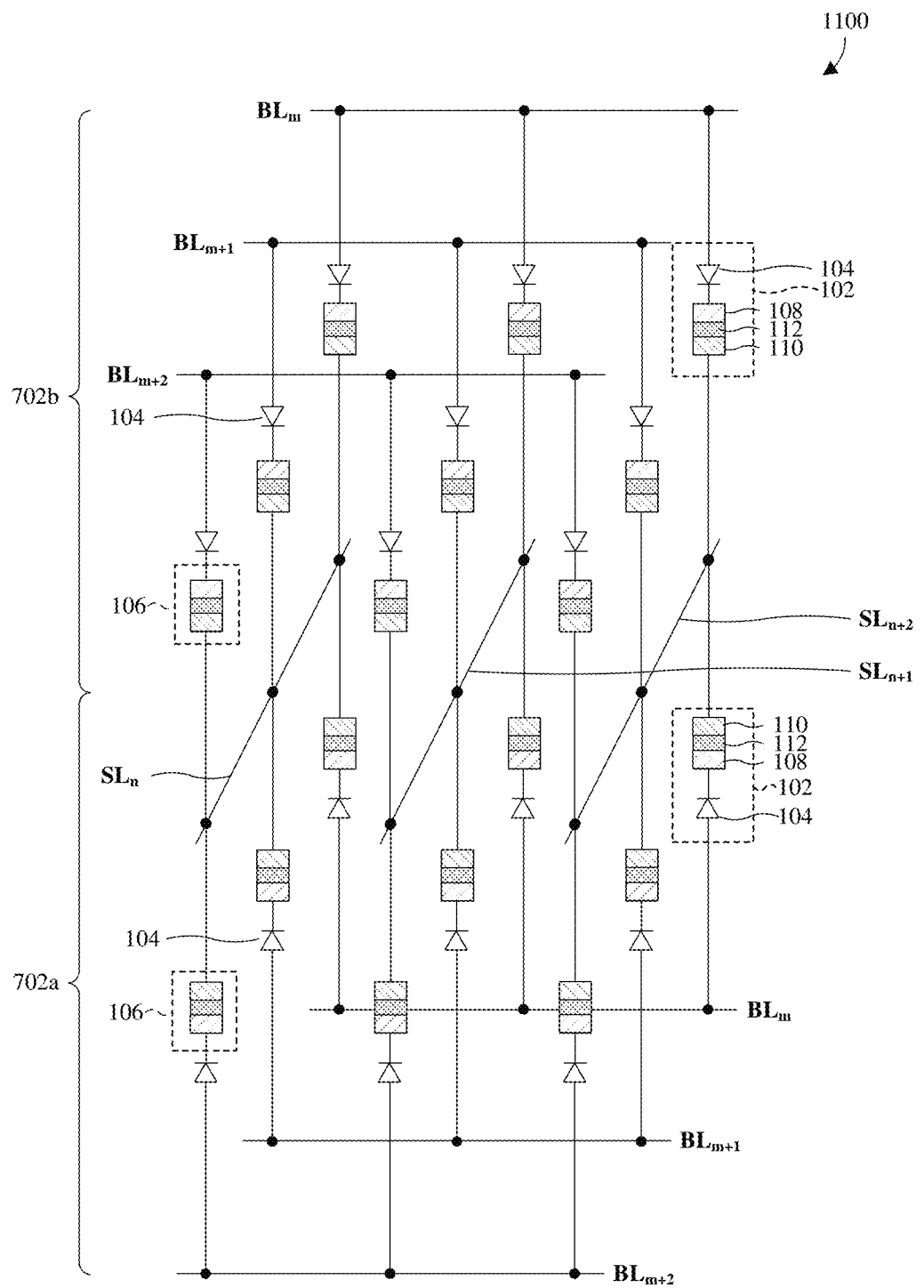

With reference to FIG. 11, a schematic view 1100 of some alternative embodiments of the 3D memory array of FIG. 10 is provided in which the first memory array 702a and the second memory array 702b share source lines. As above, the source lines are respectively labeled $SL_n$, $SL_{n+1}$, and $SL_{n+2}$, where the subscripts identify corresponding columns and n is an integer variable representing a column in the 3D memory array. Example numbers of m or n are 256, 512, 1024, etc. As an example, anodes of the unipolar selectors 104 of the first memory array 702a are connected to the first plurality of bit lines $BL_m$, $BL_{m+1}$, and $BL_{m+2}$. Cathodes of the unipolar selectors 104 of the first memory array 702a are connected to first terminals of the data-storage element 106 of the first memory array 702a. Anodes of the unipolar selectors 104 of the second memory array 702b are connected to the second plurality of bit lines $BL_m$, $BL_{m+1}$, and $BL_{m+2}$. Cathodes of the unipolar selectors 104 of the second memory array 702b are connected to first terminals of the data-storage elements 106 of the second memory array 702b. Second terminals of the data-storage elements 106 of the first memory array 702a and the second memory array 702b are respectively connected to a plurality of shared source lines $SL_n$, $SL_{n+1}$, and $SL_{n+2}$. Alternatively, it is appreciated by person in the art that the unipolar selectors 104 and the data-storage elements 106 of the first memory array 702a and the second memory array 702b can respectively arranged in mirror. Also, the first memory array 702a and the second memory array 702b can share a plurality of bit lines and respectively connected to individual source lines.

Figure 12:
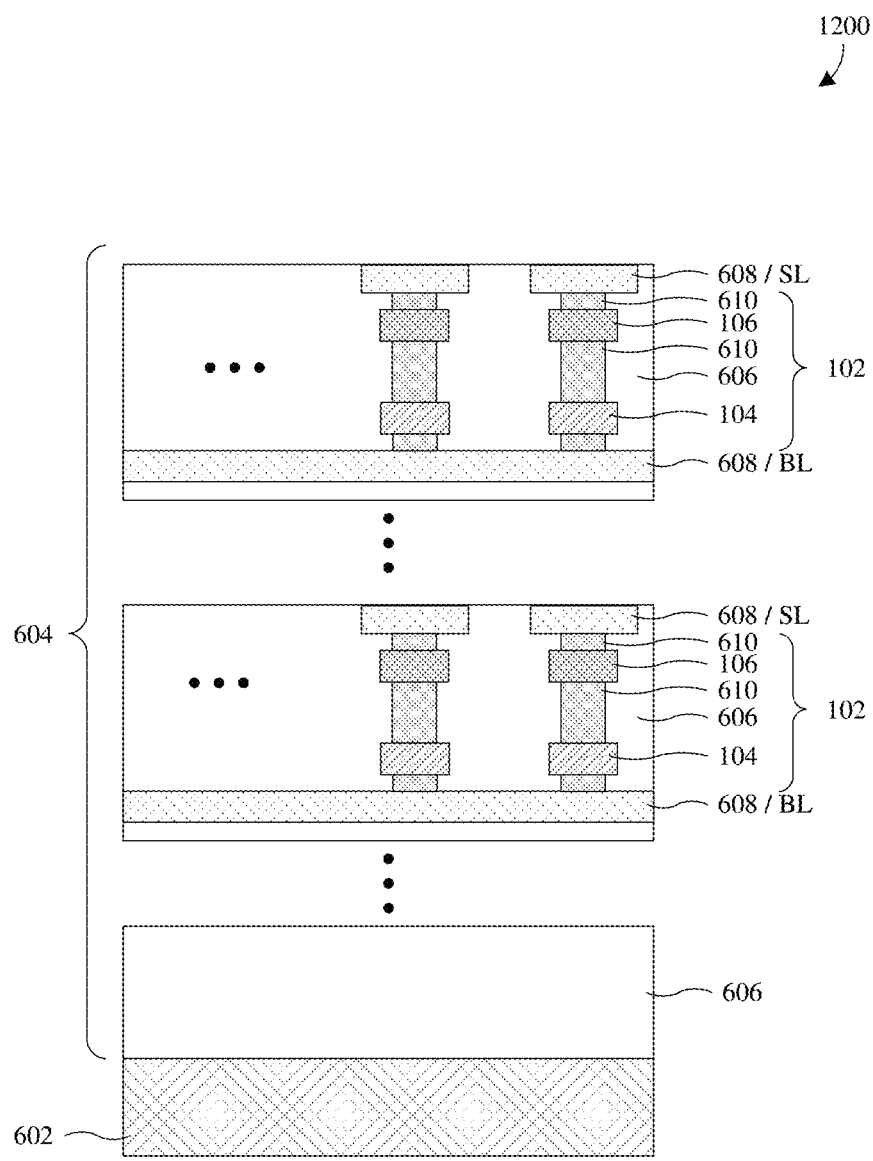
FIGS. 12 and 13 illustrate cross-sectional views of various embodiments of an integrated chip comprising the three dimensional (3D) memory array in FIGS. 10 and 11.

With reference to FIG. 12, a cross-sectional view 1200 of some embodiments of an integrated chip comprising a pair of stacked memory cells 102 from the 3D memory array of FIG. 10 is provided. The stacked memory cells 102 are at the same row and the same column in the 3D memory array.

Further, a lower one of the stacked memory cells 102 is in the first memory array 702a of FIG. 10, whereas an upper one of the stacked memory cells 102 is in the second memory array 702b of FIG. 10. The stacked memory cells 102 overlie a substrate 602 and are surrounded by an interconnect dielectric layer 606 of an interconnect structure 604. Further, wires 608 and vias 610 in the interconnect dielectric layer 606 electrically interconnect components of the stacked memory cells 102.

Figure 13:
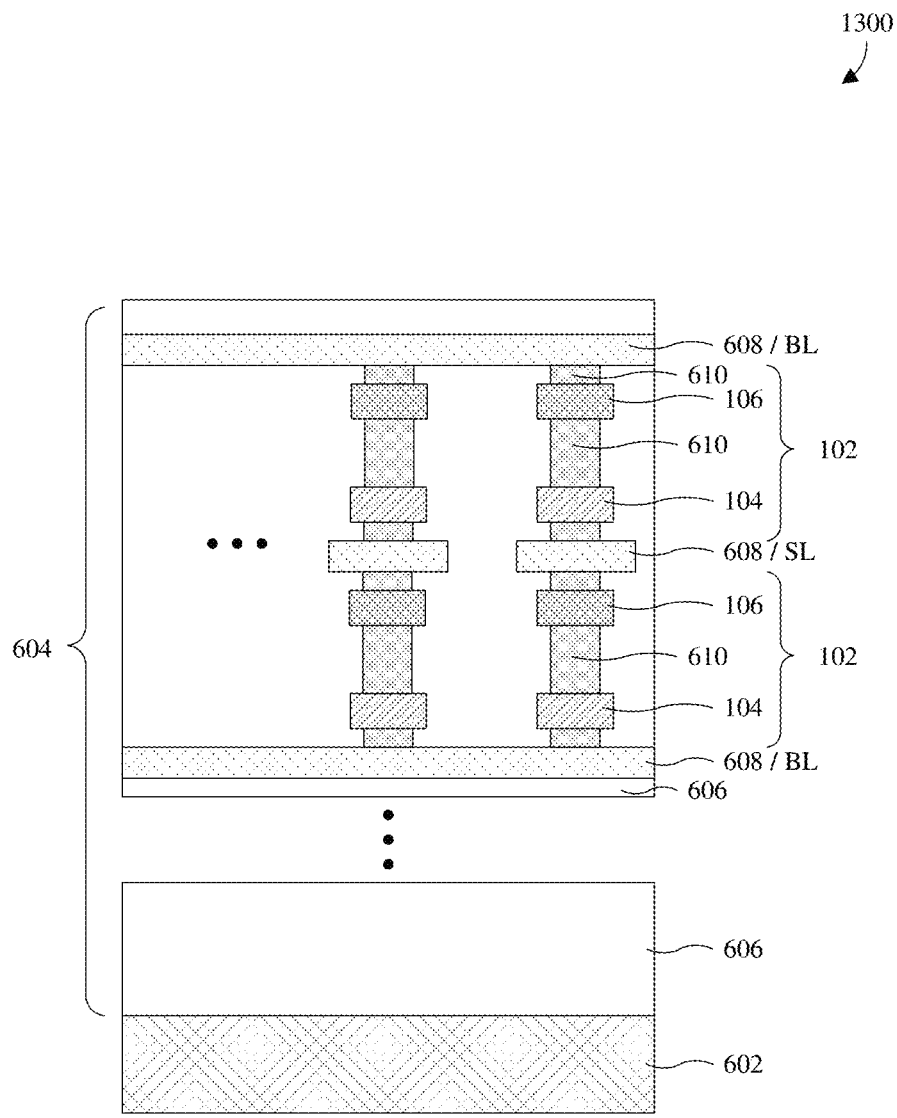

With reference to FIG. 13, a cross-sectional view 1300 of some alternative embodiments of the integrated chip of FIG. 12 is provided in which the stacked memory cells 102 are instead from the 3D memory array of FIG. 11. Accordingly, the stacked memory cells 102 share a source line SL defined by one of the wires 608.

With reference to FIGS. 14-17, a series of cross-sectional views 1400-1700 of some embodiments of a method for forming an integrated chip comprising a memory array is provided in which memory cells of the memory array comprise unipolar selector.

Figure 14:
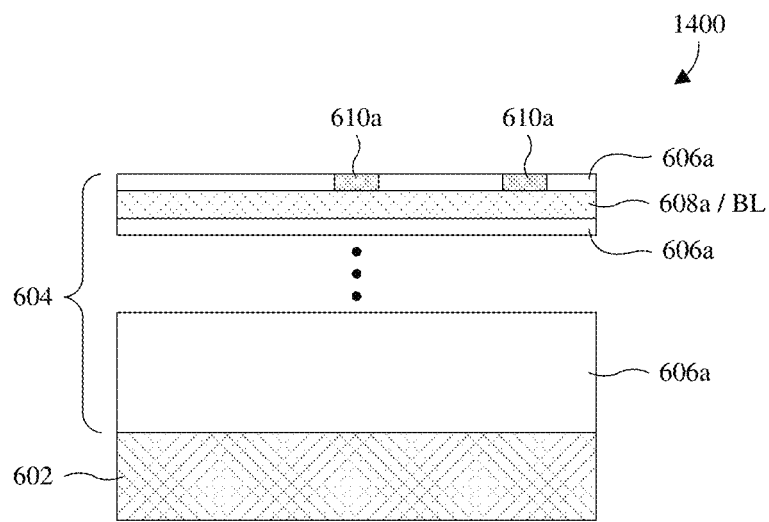
FIGS. 14-17 illustrate a series of cross-sectional views of some embodiments of a method for forming an integrated chip comprising a memory array, where memory cells of the memory array comprise unipolar selectors.

As illustrated by the cross-sectional view 1400 of FIG. 14, an interconnect structure 604 is partially formed over a substrate 602. The substrate 602 may, for example, be a bulk silicon substrate, a silicon-on-insulator (SOI) substrate, or some other suitable substrate. The interconnect structure 604 comprises a first interconnect dielectric layer 606a, a first wire 608a defining a bit line BL, and a first set of vias 610a. The first interconnect dielectric layer 606a accommodates the first wire 608a and the first vias 610a and may, for example, be or comprise silicon oxide, a low κ dielectric, some other suitable dielectric(s), or any combination of the foregoing. A low κ dielectric may be, for example, a dielectric with a dielectric constant κ less than about 3.9, 3, 2, or 1. The first wire 608a and the first vias 610a are stacked in the first interconnect dielectric layer 606a, such that the first vias 610a overlie the first wire 608a.

In some embodiments, semiconductor devices (not shown) are on the substrate 602, between the substrate 602 and the interconnect structure 604. In some embodiments, additional wires (not shown) and/or additional vias (not shown) are alternatingly stacked in the first interconnect dielectric layer 606a, between the substrate 602 and/or the first wire 608a. The additional wires and/or the additional vias may, for example, define conductive paths leading from semiconductor devices (not shown) on the substrate 602. In some embodiments, a process for partially forming the interconnect structure 604 comprises: 1) depositing a lower interconnect portion of the first interconnect dielectric layer 606a on the substrate 602; 2) forming the first wire 608a inset into the lower interconnect portion; 3) forming an upper interconnect portion of the first interconnect dielectric layer 606a on the first wire 608a and the lower interconnect portion; and 4) forming the first vias 610a inset into the upper interconnect portion. Other processes for partially forming the interconnect structure 604 are, however, amenable.

Figure 15:
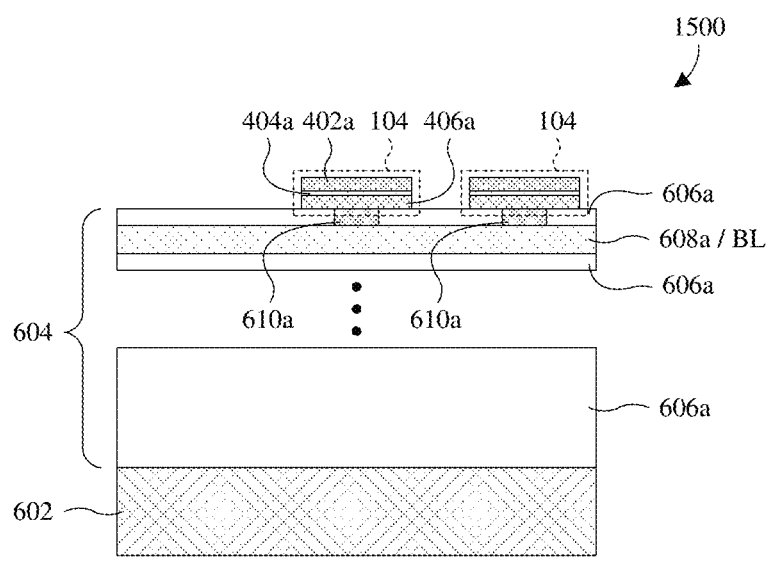

As illustrated by the cross-sectional view 1500 of FIG. 15, a unipolar selector 104 is formed overlying the bit line BL and electrically coupled to the bit line BL by one of the first vias 610a. The unipolar selector 104 comprises a cathode 302, an insulator 304, and an anode 306. The insulator 304 is between the cathode 302 and the anode 306, and the cathode 302 overlies the anode 306. The cathode 302, the insulator 304, and the anode 306 may, for example, define a PIN diode, a MIM device, or some other multilayer device. In some embodiments in which the cathode 302, the insulator 304, and the anode 306 define a PIN diode, the cathode 302 is or comprise N-type semiconductor material, the anode 306 is or comprises P-type semiconductor material, and the insulator 304 is or comprise intrinsic or lightly doped semiconductor material. The insulator 304 may, for example, be lightly doped relative to the cathode 302 and/or the anode 306. The semiconductor material for the cathode 302, the insulator 304, and the anode 306 may, for example, be or comprises polysilicon, monocrystalline silicon, or some other suitable semiconductor material. In some alternative embodiments in which the cathode 302, the insulator 304, and the anode 306 define a MIM device, the cathode 302 and the anode 306 are or comprise metal or some other suitable conductive material and/or the insulator 304 is or comprises doped hafnium oxide, some other suitable metal oxide, or some other suitable insulator material.

In some embodiments, a process for forming the unipolar selector 104 comprises: 1) depositing an anode layer on the interconnect structure 604; 2) depositing an insulator layer on the anode layer; 3) depositing a cathode layer on the insulator layer; and 4) patterning the multilayer film into the unipolar selector 104. Other processes are, however, amenable. The depositing may, for example, be performed by chemical vapor deposition (CVD), physical vapor deposition (PVD), electroless plating, electroplating, some other suitable deposition process(es), or any combination of the foregoing. The patterning may, for example, be performed by a photolithography/etching process and/or some other suitable patterning process(es).

Figure 16:
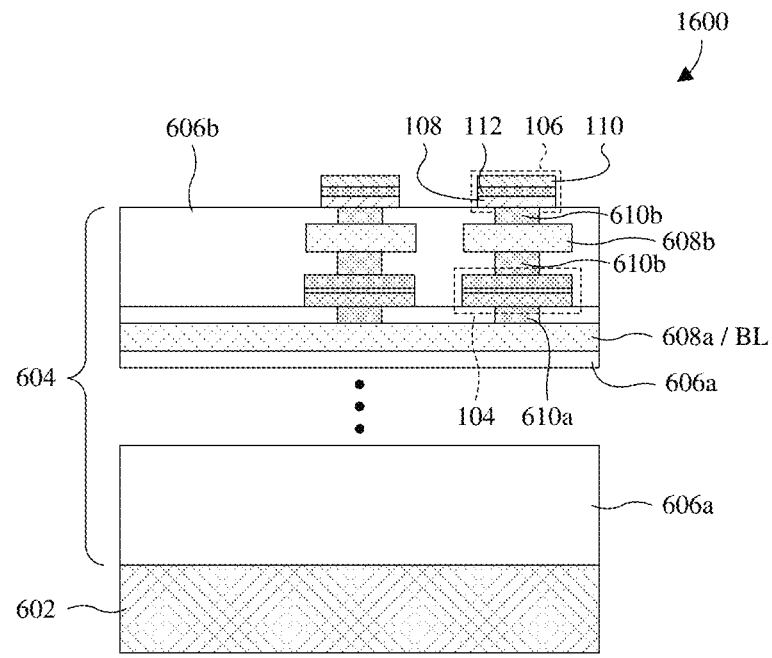

As illustrated by the cross-sectional view 1600 of FIG. 16, the interconnect structure 604 is extended around the unipolar selector 104. The extended interconnect structure 604 further comprises a second interconnect dielectric layer 606b, an isolated metal islands 608b, and a set of sub-vias 610b. In some embodiments, the isolated metal islands 608b is formed together with other metal wires of the same interconnect layer and does not connect to other memory cells. The second interconnect dielectric layer 606b accommodates the isolated metal islands 608b and the sub-vias 610b, and may, for example, be as the first interconnect dielectric layer 606a is described. The isolated metal islands 608b and the sub-vias 610b are stacked in the second interconnect dielectric layer 606b, such that the isolated metal islands 608b is electrically coupled to the unipolar selector 104 by one of the sub-vias 610b under the isolated metal islands 608b and one of the sub-vias 610b overlies the isolated metal islands 608b.

In some embodiments, a process for extending the interconnect structure 604 comprises: 1) depositing a lower interconnect portion of the second interconnect dielectric layer 606b; 2) forming the isolated metal islands 608b and sub-vias 610b underlying the isolated metal islands 608b by a dual damascene process insetting into the lower interconnect portion; 3) forming an upper interconnect portion of the second interconnect dielectric layer 606b on the isolated metal islands 608b and the lower interconnect portion; and 4) forming a sub-vias 610b overlying the isolated metal islands 608b and inset into the upper interconnect portion. Other processes for extending the interconnect structure 604 are, however, amenable.

Still as illustrated by the cross-sectional view 1600 of FIG. 16, a data-storage element 106 is formed overlying the interconnect structure 604, on one of the sub-vias 610b. The data-storage element 106 may, for example, be an MTJ, a MIM stack, or some other suitable structure for data storage. In some embodiments in which the data-storage element 106 is an MTJ comprising a reference ferromagnetic element 108, a free ferromagnetic element 110, and a barrier element 112, the barrier element 112 is non-magnetic and is sandwiched between the reference ferromagnetic element 108 and free ferromagnetic element 110. The reference ferromagnetic element 108 and free ferromagnetic element 110 are ferromagnetic, and the free ferromagnetic element 110 overlies the reference ferromagnetic element 108 and the barrier element 112. Alternatively, locations of the reference ferromagnetic element 108 and free ferromagnetic element 110 are switched.

In some embodiments, a process for forming the data-storage element 106 comprises: 1) depositing a reference layer on the interconnect structure 604; 2) depositing a barrier layer on the reference layer; 3) depositing a free layer on the barrier layer; and 4) patterning the reference, barrier, and free layers into the data-storage element 106. Other processes are, however, amenable. For example, the free layer may be deposited at 1) and the reference layer may be deposited at 3). The depositing may, for example, be performed by CVD, PVD, electroless plating, electroplating, some other suitable deposition process(es), or any combination of the foregoing. The patterning may, for example, be performed by a photolithography/etching process and/or some other suitable patterning process(es).

Figure 17:
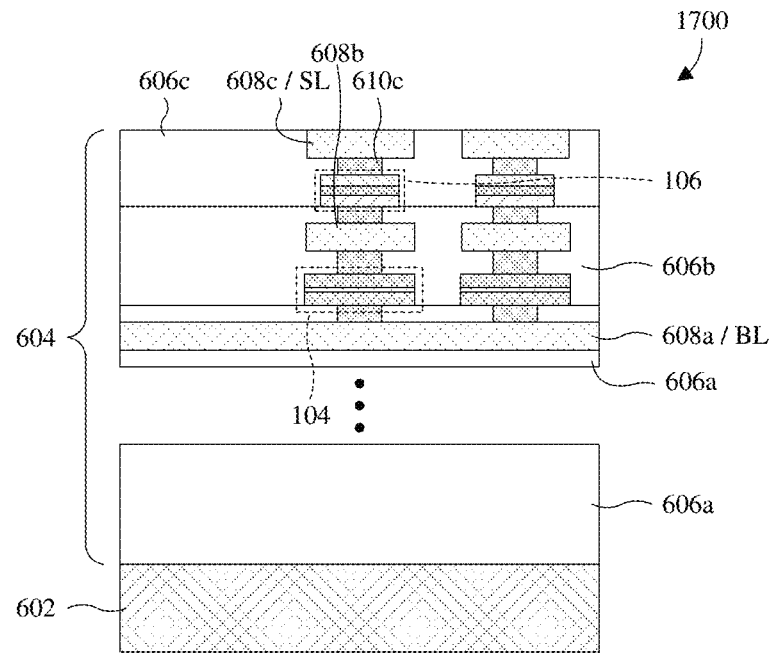

As illustrated by the cross-sectional view 1700 of FIG. 17, the interconnect structure 604 is completed around the data-storage element 106. The completed interconnect structure 604 comprises a third interconnect dielectric layer 606c, a third wire 608c defining a source line SL, and a third via 610c. The third interconnect dielectric layer 606c accommodates the third wire 608c and the third via 610c. Further, the third interconnect dielectric layer 606c may, for example, be as the first interconnect dielectric layer 606a is described. In some embodiments, a process for completing the interconnect structure 604 comprises: 1) depositing the third interconnect dielectric layer 606c; and 2) simultaneously forming the third wire 608c and the third via 610c inset into the third interconnect dielectric layer 606c. Other processes for extending the interconnect structure 604 are, however, amenable.

The method illustrated by FIGS. 14-17 may, for example, be employed to form the memory cell in any one of FIGS. 1-4, the integrated chip in any one of FIG. 6A-6D, 12 or 13, or the memory array in any one of FIGS. 7-11. Further, while the cross-sectional views 1400-1700 shown in FIGS. 14-17 are described with reference to a method, it will be appreciated that the structures shown in FIGS. 14-17 are not limited to the method and may stand alone without the method.

Figure 18:
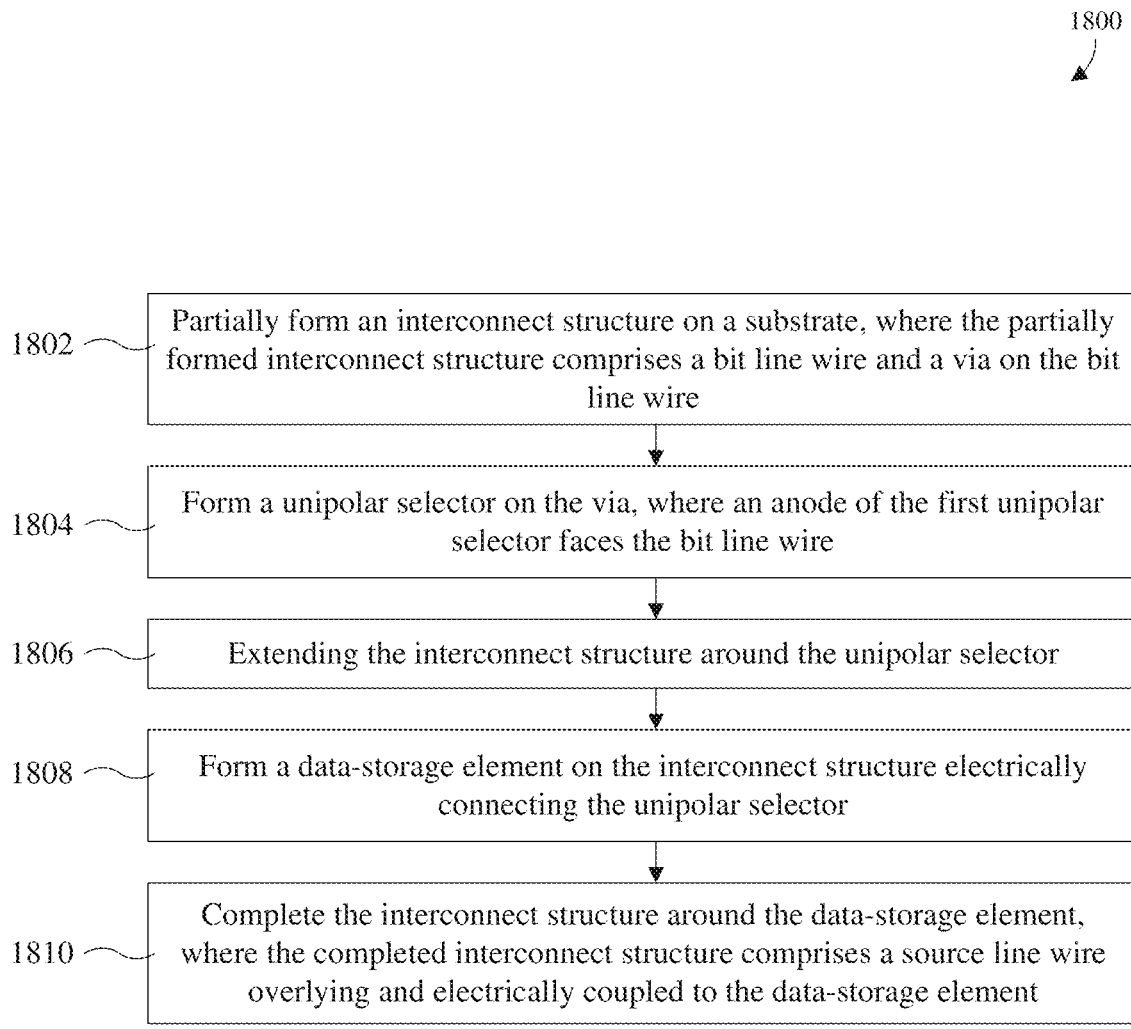
FIG. 18 illustrates a block diagram of some embodiments of the method of FIGS. 14-17.

With reference to FIG. 18, a block diagram 1800 of some embodiments of the method of FIGS. 14-17 is provided.

At 1802, an interconnect structure is partially formed on a substrate, where the partially formed interconnect structure comprises a bit line wire and a via on the bit line wire. See, for example, FIG. 14.

At 1804, a unipolar selector is formed on the via, where an anode of the first unipolar selector faces the bit line wire. See, for example, FIG. 15.

At 1806, the interconnect structure is extended around the unipolar selector. See, for example, FIG. 16.

At 1808, a data-storage element is formed and electrically coupled to the unipolar selector. See, for example, FIG. 16.

At 1810, the interconnect structure is formed around the data-storage element, where the completed interconnect structure comprises a source line wire overlying and electrically coupled to the data-storage element. See, for example, FIG. 17.

Figure 19:
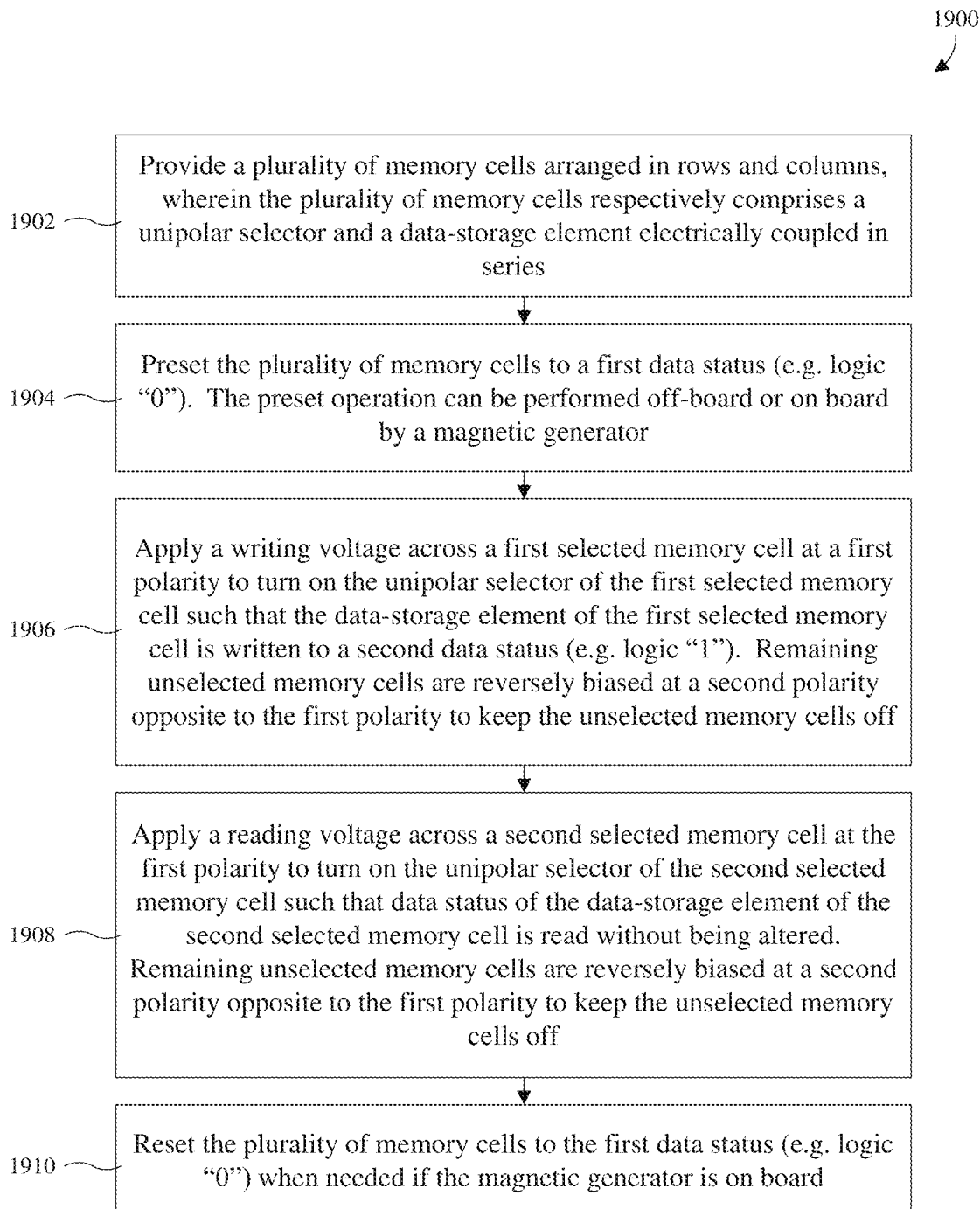
FIG. 19 illustrates a block diagram of some embodiments of a method of operating a memory device that can include a memory cell of FIGS. 1-4, a memory array of FIGS. 7-11, or an integrated chip to FIG. 6A-6D, 12 or 13.

With reference to FIG. 19, a block diagram 1900 of some embodiments of a method of operating a memory device is provided.

At act 1902, A memory device including a plurality of memory cells arranged in rows and columns is formed. The memory device can be formed by method described above associated with FIGS. 14-18 or by other applicable fabrication methods. The plurality of memory cells respectively comprises a unipolar selector and a data-storage element electrically coupled in series. The memory device may include memory cells shown by FIGS. 1-4, memory arrays shown by FIGS. 7-11, or integrated chips shown by FIG. 6A-6D, 12 or 13.

At act 1904, in some embodiments, the plurality of memory cells is pre-set to a first data state (e.g. logic "0"). In some embodiments, the pre-set operation is performed after wafer fabrication but before testing and onetime programing (OTP). The pre-set operation may be performed by applying a high external magnetic field (for example 0.5-5 tesla) to set all the memory cells by aligning magnetic directions of ferromagnetic elements. The pre-set operation can be performed off-board or on-board by a magnetic field generator. The magnetic field generator is configured to apply the high external magnetic field magnetic field that couples to the data storage elements of the memory cells and sets the data storage elements to the first data state.

At act 1906, a writing voltage is applied across a first selected memory cell at a first polarity to turn on the unipolar selector of the first selected memory cell. The data-storage element of the first selected memory cell is written to a second data state (e.g. logic "1"). The data-storage element may be written by the current flowing through the data-storage element or the voltage applied across the data-storage element. FIG. 8A shows an example schematic diagram when performing a writing operation. By using the unipolar selector, remaining unselected memory cells can be biased at a second polarity opposite to the first polarity to keep the unselected memory cells off and thus minimize leakage current. By reducing leakage current, writing disturbance can be reduced.

At act 1908, a reading voltage is applied across a second selected memory cell at the first polarity to turn on the unipolar selector of the second selected memory cell such that a data state of the data-storage element of the second selected memory cell is read. FIG. 8B shows an example schematic diagram when performing a reading operation. By using the unipolar selector, remaining unselected memory cells can be biased at a second polarity opposite to the first polarity to keep the unselected memory cells off. Thus, leakage current and its resulting reading disturbance can be reduced.

At act 1910, in some embodiments, the plurality of memory cells is reset to the first data state (e.g. logic "0") when needed. The reset operation may be performed by an on-board magnetic field generator, which can be a current carrying wire for example. The magnetic field generator is configured to generate an external magnetic field that couples to the data storage elements of the memory cells and sets the data storage elements to the first data state.

While the block diagram 1800 of FIG. 18 and the block diagram 1900 of FIG. 19 are illustrated and described herein as a series of acts or events, it will be appreciated that the illustrated orderings of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides a memory cell. The memory cell comprises a data-storage element having a variable resistance and a unipolar selector electrically coupled in series with the data-storage element. The memory cell is configured to be written by a writing voltage with a single polarity applying across the data-storage element and the unipolar selector.

In some alternative embodiments, the present application provides an integrated chip. The integrated chip comprises a first memory array disposed over a substrate and comprising a first plurality of memory cells arranged in rows and columns. The first plurality of memory cells respectively comprises a unipolar selector and a data-storage element electrically coupled in series. The integrated chip further comprises a first plurality of bit lines extending along corresponding rows of the memory array and respectively connected with first terminals of the first plurality of memory cells in the corresponding rows. The integrated chip further comprises a first plurality of source lines extending along corresponding columns of the first memory array and respectively connected with second terminals of the first plurality of memory cells in the corresponding columns.

In some alternative embodiments, the present application provides a method of operating a memory device. A memory array is provided comprising a plurality of memory cells arranged in rows and columns. The plurality of memory cells respectively comprises a unipolar selector and a data-storage element electrically coupled in series. A writing voltage is applied across a first selected memory cell at a first polarity to turn on the unipolar selector of the first selected memory cell such that the data-storage element of the first selected memory cell is written to a first data state. A reading voltage is applied across a second selected memory cell at the first polarity to turn on the unipolar selector of the second selected memory cell. A data state of the data-storage element of the second selected memory cell is read without being altered The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
    a first memory array disposed over a substrate and comprising a first plurality of memory cells arranged in rows and columns, wherein the first plurality of memory cells respectively comprises a unipolar selector and a data-storage element electrically coupled in series, wherein the data-storage element is configured to be set from a first data state to a second data state by applying a writing voltage across the data-storage element;
    a first plurality of bit lines extending along corresponding rows of the first memory array and respectively connected to first terminals of the first plurality of memory cells in corresponding rows;
    a first plurality of source lines extending along corresponding columns of the first memory array and respectively connected to second terminals of the first plurality of memory cells in the corresponding columns; and
    a magnetic field generator coupled to the first memory array and configured to generate an external magnetic field to reset the data-storage element from the second data state to the first data state.

2. The integrated chip according to claim 1, wherein the data-storage element is a magnetic tunnel junction (MTJ) comprising a reference ferromagnetic element and a free ferromagnetic element separated by a tunneling barrier layer.

3. The integrated chip according to claim 2, wherein the magnetic field generator is configured to pre-set the first plurality of memory cells of the first memory array to the first data state.

4. The integrated chip according to claim 1, wherein the magnetic field generator comprises a current carrying wire coupled to a controller and configured to generate the external magnetic field that resets a data state of the data-storage element of each of the first plurality of memory cells.

5. The integrated chip according to claim 1, further comprising:
    a second memory array stacked over the first memory array and comprising a second plurality of memory cells arranged in rows and columns, wherein the second plurality of memory cells respectively comprises a unipolar selector and a data-storage element electrically coupled in series;
    a second plurality of bit lines extending along corresponding rows of the second memory array and electrically coupled with first terminals of the second plurality of memory cells in the corresponding rows; and
    a second plurality of source lines extending along corresponding columns of the second memory array and respectively connected with second terminals of the second plurality of memory cells in the corresponding columns.

6. The integrated chip according to claim 5, wherein the first memory array and the second memory array are embedded in a logic circuit disposed on the substrate.

7. The integrated chip according to claim 1, further comprising:
    a second memory array comprising a second plurality of memory cells arranged in rows and columns, wherein the second plurality of memory cells respectively comprises a unipolar selector and a data-storage element electrically coupled in series; and
    a second plurality of bit lines extending along corresponding rows of the second memory array and electrically coupled with first terminals of the second plurality of memory cells in the corresponding rows; and
    wherein the first plurality of source lines also extends along corresponding columns of the second memory array and electrically coupled with second terminals of the memory cells of the second memory array in the corresponding columns.

8. The integrated chip according to claim 7,
    wherein anodes of the unipolar selectors of the first memory array are connected to the first plurality of bit lines, and wherein cathodes of the unipolar selectors of the first memory array are connected to first terminals of the data-storage element of the first memory array;

wherein anodes of the unipolar selectors of the second memory array are connected to the second plurality of bit lines, and wherein cathodes of the unipolar selectors of the second memory array are connected to first terminals of the data-storage elements of the second memory array; and wherein second terminals of the data-storage elements of the first memory array and the second memory array are respectively connected to the first plurality of source lines.

9. An integrated chip, comprising:
a memory array disposed over a substrate and comprising a plurality of memory cells, each of the plurality of memory cells comprising:
a data-storage element having a variable resistance; and
a unipolar selector electrically coupled in series with the data-storage element;
wherein the memory cell is configured to be written from a first data state to a second data state by a single polarity writing voltage applied across the data-storage element and the unipolar selector; and
wherein the memory cell is absent of an additional selector directly coupled to the data-storage element; and
a magnetic field generator configured to generate a magnetic field coupled to the data-storage element and reset the data-storage element from the second data state to the first data state.

10. The integrated chip according to claim 9, wherein the magnetic field generator is configured to simultaneously reset the data-storage element of each of the plurality of memory cells.

11. The integrated chip according to claim 9, wherein the data-storage element is configured to be read by applying a reading voltage across the data-storage element and the unipolar selector with the same polarity as the single polarity writing voltage.

12. The integrated chip according to claim 9, wherein the data-storage element comprises a magnetic tunnel junction (MTJ), and wherein the MTJ comprises a reference ferromagnetic element and a free ferromagnetic element separated by a tunneling barrier layer.

13. The integrated chip according to claim 12,
wherein a cathode of the unipolar selector is directly connected to the reference ferromagnetic element of the MTJ;
wherein an anode of the unipolar selector is directly connected to a source line; and
wherein the free ferromagnetic element of the MTJ is directly connected to a bit line.

14. The integrated chip according to claim 9, wherein the unipolar selector is a PIN diode.

15. An integrated chip, comprising:
a memory array comprising a plurality of memory cells arranged in rows and columns, wherein the plurality of memory cells is configured to be pre-set to a first data state by an external magnetic field and respectively comprises a unipolar selector and a data-storage element electrically coupled in series;
wherein the plurality of memory cells is configured to have a data-storage element of a first selected memory cell written from the first data state to a second data state when applying a writing voltage across the first selected memory cell at a first polarity to turn on the unipolar selector of the first selected memory cell; and
wherein the plurality of memory cells is configured to have a data state of a data-storage element of a second selected memory cell read when applying a reading voltage across the second selected memory cell at the first polarity to turn on the unipolar selector of the second selected memory cell.

16. The integrated chip according to claim 15, wherein the plurality of memory cells is configured to have unselected memory cells biased at a second polarity opposite to the first polarity when applying the writing voltage across the first selected memory cell.

17. The integrated chip according to claim 16, wherein the unselected memory cells are reversely biased by an inhibiting voltage having an absolute value that is equal to that of the writing voltage.

18. The integrated chip according to claim 15,
wherein the plurality of memory cells is configured to have unselected memory cells biased at a second polarity opposite to the first polarity when applying the reading voltage across the second selected memory cell; and
wherein the unselected memory cells are biased by an inhibiting voltage having an absolute value that is equal to that of the reading voltage when applying the reading voltage to the second selected memory cell.

19. The integrated chip according to claim 15, wherein pre-setting the plurality of memory cells to the first data state is performed by applying the external magnetic field generated by an off-board magnetic generator.

20. The integrated chip according to claim 15, wherein the plurality of memory cells is configured to be reset to the first data state by applying the external magnetic field using a current carrying wire that is magnetically coupled to the data-storage elements of the plurality of memory cells.

* * * * *